United States Patent
Kim et al.

(10) Patent No.: US 9,608,225 B2
(45) Date of Patent: Mar. 28, 2017

(54) LIGHT EMITTING DEVICE AND METHOD OF FABRICATING THE SAME

(75) Inventors: Do-Hwan Kim, Anyang-si (KR); Sang-Yoon Lee, Seoul (KR); Kwanghee Lee, Gwangju (KR); Sung Heum Park, Gwangju (KR); Shinuk Cho, Santa Barbara, CA (US); Jae-Kwan Lee, Santa Barbara, CA (US); Alan J. Heeger, Santa Barbara, CA (US)

(73) Assignees: Samsung Electronics Co., Ltd., Gyeonggi-do (KR); The Regents of the University of California, Oakland, CA (US)

(*) Notice: Subject to any disclaimer, the term of this patent is extended or adjusted under 35 U.S.C. 154(b) by 935 days.

(21) Appl. No.: 12/656,225

(22) Filed: Jan. 21, 2010

(65) Prior Publication Data
US 2011/0175064 A1 Jul. 21, 2011

(51) Int. Cl.
| | |
|---|---|
| H01L 51/52 | (2006.01) |
| H01L 51/56 | (2006.01) |
| H01L 51/50 | (2006.01) |
| H01L 27/32 | (2006.01) |

(52) U.S. Cl.
CPC ...... *H01L 51/5036* (2013.01); *H01L 27/3209* (2013.01); *H01L 51/50* (2013.01); *H01L 51/5048* (2013.01); *H01L 51/5203* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 5,563,424 A | 10/1996 | Yang et al. | |
| 5,917,280 A | 6/1999 | Burrows et al. | |
| 6,232,714 B1 | 5/2001 | Shen et al. | |
| 6,833,283 B2 | 12/2004 | Epstein et al. | |
| 7,005,484 B1 * | 2/2006 | Holmes et al. | 526/75 |
| 2005/0046337 A1 * | 3/2005 | Chin et al. | 313/504 |

(Continued)

FOREIGN PATENT DOCUMENTS

| | | |
|---|---|---|
| JP | 2005-1511296 | 8/2001 |
| JP | 2005285749 A * | 10/2005 |

(Continued)

OTHER PUBLICATIONS

Machine English translation of Eguchi et al. (JP 2005-285749 A). Aug. 16, 2016.*

(Continued)

*Primary Examiner* — J. L. Yang
(74) *Attorney, Agent, or Firm* — Harness, Dickey, & Pierce, P.L.C.

(57) ABSTRACT

A light emitting device may include a first electrode on a substrate, a first emission layer on the first electrode, a buffer layer on the first emission layer, a middle electrode on the buffer layer, a second emission layer on the middle electrode, and a second electrode on the second emission layer. The buffer layer may include a material selected from the group consisting of a metal oxide, a polyelectrolyte, and a combination thereof. The first emission layer, buffer layer, middle electrode, and second emission layer may be fabricated using a wet process.

14 Claims, 3 Drawing Sheets

(56) References Cited

U.S. PATENT DOCUMENTS

| | | | |
|---|---|---|---|
| 2005/0116633 A1* | 6/2005 | Yamazaki et al. | 313/506 |
| 2006/0054883 A1* | 3/2006 | Hanna et al. | 257/40 |
| 2007/0241676 A1* | 10/2007 | Park et al. | 313/506 |
| 2008/0251780 A1* | 10/2008 | Li et al. | 257/13 |
| 2010/0059740 A1* | 3/2010 | Yersin | C09K 11/06 257/40 |
| 2010/0096656 A1* | 4/2010 | Nguyen et al. | 257/98 |

FOREIGN PATENT DOCUMENTS

| | | | |
|---|---|---|---|
| KR | 10-2002-0040760 | 5/2002 | |
| KR | 10-2005-0049436 | 5/2005 | |
| KR | 20070101958 A | 10/2007 | |
| WO | WO-2008/087031 A1 * | 7/2008 | C09K 11/06 |

OTHER PUBLICATIONS

"Flexible light-emitting three-terminal device with color controlled emission" Sung Heum Park et al., Organic Electronics, vol. 10, 2009, pp. 426-431.

"Efficient Top-Gate, Ambipolar, Light-Emitting Field-Effect Transistors Based on a Green-Light-Emitting Polyfluorene," Jana Zaumseil et al., Advanced Materials, 2006, pp. 2708-2712.

Korean Office Action dated Feb. 29, 2016 issued in corresponding Korean Patent Application No. 10-2010-0027342 (English translation provided).

Korean Office Action dated Nov. 29, 2016 issued in corresponding Korean Patent Application No. 10-2010-0027342 (English translation provided).

* cited by examiner

Green color

FIG.3D

Green color

LIGHT EMITTING DEVICE AND METHOD OF FABRICATING THE SAME

BACKGROUND

1. Field

Example embodiments relate to a light emitting device and a method of fabricating the same.

2. Description of the Related Art

An organic light emitting diode (OLED) in which an organic material is used in a light emitting layer may be a useful light emitting device for a display. By using the OLED, fabricating a display in a simpler process may be possible in order to provide a flexible display having a wider screen and higher luminance than a liquid crystal display and save electric power.

In addition, there may be an organic field effect transistor (OFET) having one switching member for controlling the display OLED and a channel layer of an organic material. However, if the OLED and the OFET are assembled to provide a display, the process becomes complicated.

SUMMARY

Example embodiments provide a higher efficiency-lower voltage light emitting device capable of fine controlling a light emitting color. Example embodiments also provide a method of fabricating a light emitting device if which the process may be simplified at reduced costs to improve productivity.

According to example embodiments, a light emitting device may include a first electrode on a substrate, a first emission layer on the first electrode, a buffer layer on the first emission layer, a middle electrode on the buffer layer, a second emission layer on the middle electrode, and a second electrode on the second emission layer. The buffer layer may include a material selected from the group consisting of a metal oxide, a polyelectrolyte, and a combination thereof.

The substrate may include a material selected from the group consisting of glass, quartz, silicon, synthetic resin, metal, and a combination thereof. The first electrode may include a material having a work function of about 4.3 eV to about 5.0 eV, and the second electrode may include a material having a work function of about 2.3 eV to about 2.7 eV.

The middle electrode may include a material having a work function of about 5.0 eV to about 5.2 eV. The middle electrode may include a conductive polymer of polythiophene, polyaniline, polypyrrole, polyacene, polyphenylene, polyphenylenevinylene, a derivative thereof, a copolymer thereof, or a mixture thereof. The conductive polymer may include polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxylpyrrole), poly(3-methyl-4-hydroxylpyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), or a mixture thereof. The conductive polymer may be doped with a dopant.

The metal oxide may include a metal selected from titanium (Ti), zinc (Zn), strontium (Sr), indium (In), barium (Ba), potassium (K), niobium (Nb), iron (Fe), tantalum (Ta), tungsten (W), bismuth (Bi), nickel (Ni), copper (Cu), molybdenum (Mo), cerium (Ce), platinum (Pt), silver (Ag), rhodium (Rh), ruthenium (Ru), or a combination thereof. The polyelectrolyte may include a cationic polyelectrolyte, an anionic polyelectrolyte, or a non-ionic polyelectrolyte. The cationic polyelectrolyte may be represented by the following Chemical Formulae 1 to 3.

[Chemical Formula 1]

[Chemical Formula 2]

[Chemical Formula 3]

In the above Chemical Formulae 1 to 3, $R_1$ to $R_8$ may be the same or different, and may be selected from the group consisting of hydrogen, an alkyl, an alkenyl, an allyl, an aryl, (meth)acryl, (meth)acryloyl, and a combination thereof, and Y may be a counter anion.

The cationic polyelectrolyte may include one selected from the group consisting of a fluorene alkyl ammonium salt, poly(diallyldialkyl ammonium salt), poly((meth)acryloyloxyalkyltrialkyl ammonium salt), poly((meth)acryloyloxyalkylaryldialkyl ammonium salt), poly(arylamine salt), poly(allylamine salt), poly(alkylene imine), poly((meth)acrylamide), poly(alkenyl amine), and a combination thereof.

The anionic polyelectrolyte may include one selected from the group consisting of poly(styrene sulfonate) (PSS), poly(acrylic acid), poly(methacrylic acid), polymethyl (meth)acrylate, polymaleic acid, poly(alkylene oxide), poly(alkenyl sulfate), poly(alkenyl sulfonate), poly(3-sulfoalkyl (meth)acrylate), poly((meth)acrylamido-2-alkyl-alkanesulfonate, and a combination thereof. The polyelectrolyte may have a weight average molecular weight of about 500 to about 20,000 g/mol.

The light emitting device may further include a buffer layer between at least one of the first electrode and the first emission layer, and the second emission layer and the second electrode. The light emitting device may further include an electron transport layer (ETL) between at least one of the first electrode and the first emission layer, and the second emission layer and the second electrode. The light emitting device may further include a hole blocking layer (HBL) between at least one of the first electrode and the first emission layer, and the second electrode and the second emission layer.

According to example embodiments, a method of manufacturing a light emitting device may include providing a first electrode on a substrate, providing a first emission layer on the first electrode, providing a buffer layer on the first emission layer, providing a middle electrode on the buffer layer, providing a second emission layer on the middle electrode, and providing a second electrode on the second emission layer, wherein the first emission layer, the buffer layer, the middle electrode, and the second emission layer may be made using a wet process.

The wet process may be selected from the group consisting of gravure printing, off-set printing, screen printing, inkjet printing, spin coating, spray coating, and combinations thereof. The buffer layer may be formed by a sol-gel reaction of a metal oxide precursor with the first emission layer or by coating a composition including a polyelectrolyte on the first emission layer.

BRIEF DESCRIPTION OF THE DRAWINGS

Example embodiments will be more clearly understood from the following detailed description taken in conjunction with the accompanying drawings. FIGS. 1-3D represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will be described more fully hereinafter in the following detailed description, in which some but not all example embodiments of the inventive concepts are described. Example embodiments may be embodied in many different forms and are not to be construed as limited to example embodiments set forth herein.

In the drawings, the thickness of layers, films, panels, regions, etc., are exaggerated for clarity. Like reference numerals designate like elements throughout the specification. It will be understood that when an element such as a layer, film, or substrate is referred to as being "on" another element, it may be directly on the other element or intervening elements may also be present. In contrast, when an element is referred to as being "directly on" another element, there are no intervening elements present.

As used herein, when a definition is not otherwise provided, the term "(meth)acryloyl" refers to acryloyl and methacryloyl, the term "(meth)acrylate" refers to acrylate and methacrylate, and the term "(meth)acryl" refers to acryl and methacryl.

As used herein, when definition is not otherwise provided, the term "alkyl" refers to a $C_1$ to $C_{15}$ alkyl, the term "alkane" refers to a $C_1$ to $C_{15}$ alkane, the term "alkenyl" refers to a $C_2$ to $C_{10}$ alkenyl, the term "aryl" refers to a $C_6$ to $C_{18}$ aryl, and the term "alkylene" refers to a $C_1$ to $C_{10}$ alkylene.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "including", and/or "includes", when used in this application, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
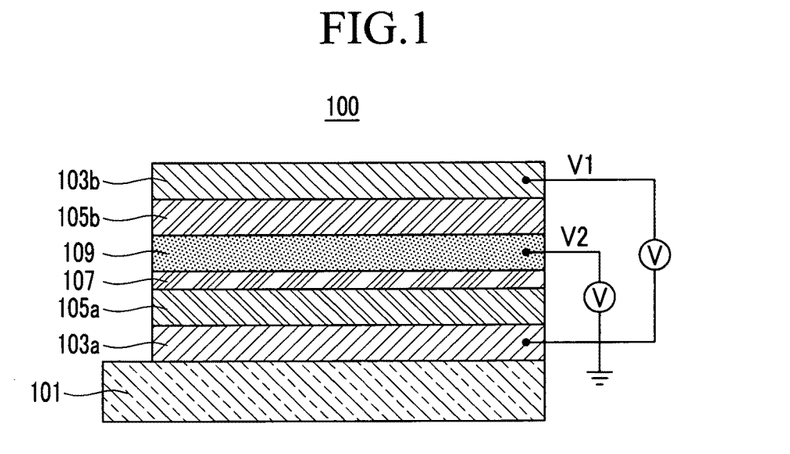
FIGS. 1 and 2 are cross-sectional views of a light emitting device according to example embodiments.
Figure 2:
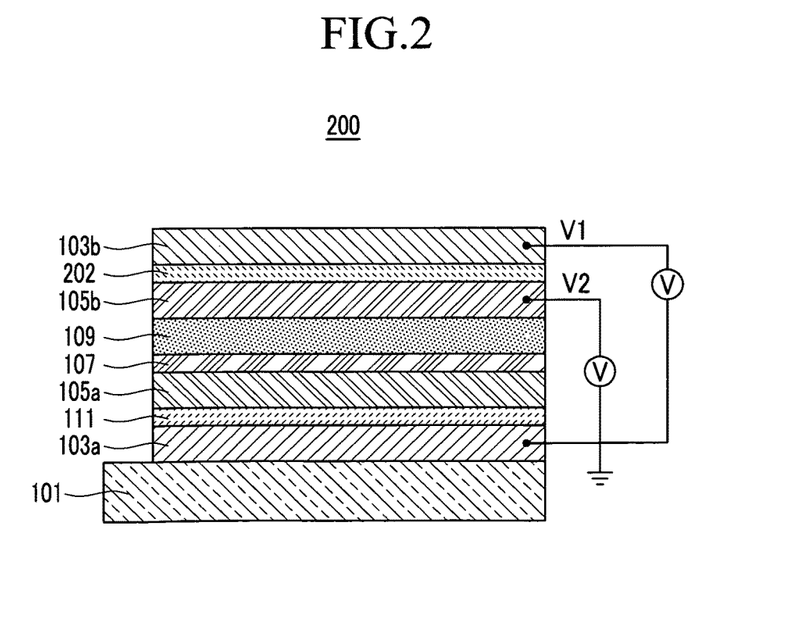

Hereinafter, referring to FIGS. 1 to 3, the light emitting device according to example embodiments is described. FIG. 1 is a cross-sectional view of a light emitting device 100 according to example embodiments. Referring to FIG. 1, a first electrode 103a and a second electrode 103b may be positioned on a substrate 101, a first emission layer 105a may be positioned on the first electrode 103a, and a second emission layer 105b may be positioned under the second electrode 103b.

The substrate 101 may include a material selected from the group consisting of glass, quartz, silicon, a synthetic resin, a metal, and a combination thereof. The synthetic resin may include polyethylenenaphthalate (PEN), polyethyleneterephthalate (PET), polycarbonate, polyvinylalcohol, polyacrylate, polyimide, polynorbornene and/or polyethersulfone (PES). The metal plate may include a stainless steel foil and/or an aluminum foil. When the synthetic resin is included, the synthetic resin is applicable to a flexible light emitting device.

The first electrode 103a may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof. In addition, these metals may be laminated to provide a first electrode. The first electrode 103a may have a thickness of about 20 to about 100 nm.

The second electrode 103b may include a material having a work function of about 2.3 eV to about 2.7 eV or about 2.5 eV to about 2.7 eV. According to example embodiments, the second electrode 103b may include Ba:Al. The second electrode 103b may have a thickness of about 20 to about 100 nm.

The first emission layer 105a and the second emission layer 105b may include a material capable of emitting green (G) light and a material capable of emitting red (R) light, respectively, which may be changeable. The light emitting materials may include any organic compound and/or inorganic compound without limitations. For example, a material emitting green light may include poly(p-phenylenevinylene) (p-PPV). A material emitting red light may include MEH-PPV (poly[2-methoxy-5-(2'-ethyl-hexyloxy)-1,4-phenylene vinylene], which may emit orange light.

A middle electrode 109 may be positioned between the first emission layer 105a and the second emission layer 105b. The middle electrode 109 may include a material having a work function of about 5.0 eV to about 5.2 eV. According to example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof. Examples of the conductive polymer may include polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxylpyrrole), poly(3-methyl-4-hydroxylpyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid) and/or poly(3-anilinesulfonic acid).

The conductive polymer may be doped with a dopant in order to control electrical conductivity. The dopant may include a halogen compound, a Lewis acid, a protonic acid, an organic cyano compound, an organometallic compound, an alkali metal, an alkaline-earth metal and/or a quaternary amine compound.

The halogen compound may include chlorine, bromine, iodine, iodine chloride, iodine bromide and/or iodine fluoride. The Lewis acid may include phosphorus penta-fluorinate, arsenic penta-fluorinate, antimony penta-fluorinate, tri-fluoroborane, boron trichloride and/or boron tri-fluorinate. The protoic acid may include an inorganic acid, e.g., hydrochloric acid, sulfuric acid, nitric acid, phosphoric acid, fluoroboric acid, hydrofluoric acid and/or perchloric acid, and an organic acid, e.g., organic carboxylic acid and/or organic sulfonic acid. The organic cyano compound may include a compound having at least two cyano groups in a conjugated bond. For example, the organic cyano compound may include tetracyanoethylene, tetracyanoethylene oxide, tetracyano benzine, tetracyanoquinodimethane and/or tetracyanoazanaphthalene.

The doped conductive polymer may include poly(styrenesulfonate) (PSS)-doped poly(3,4-ethylenedioxy-thiophene) (PEDOT) (PEDOT:PSS) and/or poly(styrenesulfonic acid)-doped polyaniline (PAni:PSS). A buffer layer 107 may be positioned between the first emission layer 105a and the middle electrode 109, and may include a material selected from the group consisting of a metal oxide, a polyelectrolyte, and combinations thereof. The combination thereof refers to the metal oxide and polyelectrolyte being mixed or laminated to provide a multi-layer. In addition, the different kinds of metal oxide or polyelectrolyte may be laminated.

The metal oxide may include a metal selected from titanium (Ti), zinc (Zn), strontium (Sr), indium (In), barium (Ba), potassium (K), niobium (Nb), iron (Fe), tantalum (Ta), tungsten (W), bismuth (Bi), nickel (Ni), copper (Cu), molybdenum (Mo), cerium (Ce), platinum (Pt), silver (Ag), rhodium (Rh), ruthenium (Ru), or a combination thereof. The combination thereof refers to a composite metal oxide including at least two metals mentioned above or a mixture of the metal oxide.

The polyelectrolyte may include a cationic polyelectrolyte, an anionic polyelectrolyte, or a non-ionic polyelectrolyte. The cationic polyelectrolyte may be represented by one of the following Chemical Formulae 1 to 3.

[Chemical Formula 1]

[Chemical Formula 2]

[Chemical Formula 3]

In the above Chemical Formulae 1 to 3, $R_1$ to $R_8$ may be the same or different, and may be selected from the group consisting of hydrogen, an alkyl, an alkenyl, an allyl, an aryl, (meth)acryl, (meth)acryloyl, and a combination thereof, and Y may be a counter anion, and may be selected from $X^-$ (X may be a halogen of F, Cl, Br, or I), $BF_4^-$, $PF_6^-$, $(CF_3SO_2)_2N^-$, $CF_3SO_3^-$, $CF_3CO_2^-AsF_6^-$, $SbF_6^-$, $AlCl_4^-$, $HSO_4^-$, $ClO_4^-$, $CH_3SO_3^-$, $CF_3SO_3^-$, or $(CF_3SO_2)_2N^-$, but may not be limited thereto.

Examples of the cationic polyelectrolyte may include one selected from the group consisting of a fluorene alkyl ammonium salt, e.g., poly[2,7-(9,9-bis(2'-ethylhexyl)fluorene)] (PFP) triethyl ammonium bromide; a poly(diallyldialkyl ammonium salt), e.g., poly(diallyldimethylammoniumchloride); a poly((meth)acryloyloxyalkyltrialkyl ammonium salt), e.g., poly(acryloyloxyethyltrimethylammonium chloride) and/or poly(methacryloyloxyethyltrimethylammonium chloride); poly((meth)acryloyloxyalkylaryldialkyl ammonium salt), e.g., poly((meth)acryloyloxyethylbenzyldimethylammonium chloride); poly(arylamine salt), e.g., poly(aryl amine chloride); poly(allylamine salt), e.g., poly(allyl amine chloride) (PAH); poly(alkylene imine), e.g., poly(ethylene imine); poly(alkenyl amine), e.g., poly((meth)acrylamide); poly(vinyl amine), and a combination thereof.

The anionic polyelectrolyte may include one selected from the group consisting of poly(styrene sulfonate) (PSS); poly(acrylic acid); poly(methacrylic acid); polymethyl (meth)acrylate; polymaleic acid; poly(alkylene oxide), e.g., poly(ethylene oxide); poly(alkenyl sulfate), e.g., poly(vinyl sulfate); poly(alkenyl sulfonate), e.g., poly(vinyl sulfonate); poly(3-sulfoalkyl(meth)acrylate), e.g., poly(3-sulfopropyl methacrylate); poly((meth)acrylamido-2-alkyl-alkanesulfonate, e.g., poly(acrylamido-2-methyl-propanesulfonate); and a combination thereof. The counter cation of the anionic polyelectrolyte may include a cation, e.g., an alkali metal and/or an alkaline-earth metal.

Each of the cationic polyelectrolyte, the anionic polyelectrolyte, and the non-ionic polyelectrolyte may be prepared by radical polymerization of each monomer. According to example embodiments, the polyelectrolyte may have a weight average molecular weight of about 500 to about 20,000 g/mol, for example, about 500 g/mol to 11,000 g/mol. A polyelectrolyte having the weight average molecular weight within the range may show improved mechanical characteristics.

As the buffer layer 107 shows amphiphilicity, the buffer layer 107 may improve adherence between the first emission layer 105a and the middle electrode 109. For example, when the first emission layer 105a includes p-PPV and the middle electrode 109 includes PEDOT:PSS, the interface may be separated because p-PPV may be hydrophobic and PEDOT:PSS may be hydrophilic. The buffer layer 109 may improve the adherence between layers to prevent or reduce interface separation.

When a positive voltage is applied between the first electrode 103a and the second electrode 103b, a hole may be implanted from the middle electrode 109 to the first emission layer 105a, and an electron may be implanted from the first electrode 103a to the first emission layer 105a. In example embodiments, the first emission layer 105a may emit light. When a negative voltage is applied between the first electrode 103a and the second electrode 103b, a hole may be implanted from the middle electrode 109 to the second emission layer 105b, and an electron may be implanted from the second electrode 103b to the second emission layer 105b. In example embodiments, the second emission layer 105b may emit light. The height of the electron implant barrier may be controlled by adjusting the voltage (V1) applied between the first electrode 103a and the second electrode 103b and the voltage (V2) applied between the middle electrode 109 and the first electrode 103a, so that the light emitting color of the light emitting device 100 may be finely controlled. The polyelectrolyte for the buffer layer 107 may act as a hole transport layer (HTL) transferring holes from the middle electrode 109 to the first light emitting layer 105a.

The light emitting device of example embodiments may further include a buffer layer between the first electrode 103a and the first emission layer 105a or between the second emission layer 105b and the second electrode 103b. FIG. 2 is a cross-sectional view showing a light emitting device 200 further including additional buffer layers. In FIG. 2, the same descriptions as in FIG. 1 may be omitted, and the same reference numerals indicate the same constituent elements. Referring to FIG. 2, a first buffer layer 201 may be further included between the first electrode 103a and the first emission layer 105a, and a second buffer layer 202 may be positioned between the second emission layer 105b and the second electrode 103b.

The first buffer layer 201 and the second buffer layer 202 may include the polyelectrolyte. The first buffer layer 201 including the polyelectrolyte may function as an electron transport layer (ETL) transferring electrons from the first electrode 103a to the first emission layer 105a, and the second buffer layer 202 may function as an electron transport layer (ETL) transferring electrons from the second electrode 103b to the second emission layer 105b.

The light emitting device 200 may further include an electron transport layer (ETL) between the first electrode 103a and the first emission layer 105a or between the second emission layer 105b and the second electrode 103b. The electron transport layer may include tris(8-quinolinolato) aluminum (Alq3), a 1,3,4-oxadiazole derivative, or a 1,2,4-triazole (TAZ) derivative.

A hole blocking layer (HBL) may be positioned between the first electrode 103a and the first emission layer 105a (or the first buffer layer 201) or between the second electrode 103b and the second emission layer 105b (or the second buffer layer 202).

Hereinafter, a method of manufacturing the light emitting device 100 shown in FIG. 1 is described. A first electrode 103a may be deposited on a substrate 101. A composition including a light emitting material may be coated on the first electrode 103a to provide a first emission layer 105a. The coating method may include a wet process, e.g., gravure printing, offset printing, screen printing, inkjet printing, spin coating and/or spray coating.

A buffer layer 107 may be provided on the first light emitting layer 105a by coating a solution including a metal oxide precursor or by coating a composition including a polyelectrolyte on the first light emitting layer 105a. The coating method may include a wet process, e.g., gravure printing, off-set printing, screen printing, inkjet printing, spin coating and/or spray coating.

The metal oxide precursor may include an alkoxide or a halide (e.g., chloride) including the metal. The metal oxide precursor may be added to a solvent at about 1 to about 5 wt %, but the metal oxide precursor may be added in an adequate amount depending upon the coating process. The metal oxide precursor may be added to a solvent, e.g., alcohol, chloroform, chlorobenzene, difluorobenzene, tetrahydrofuran, xylene, dimethylsulfoxide and/or toluene, to provide a coating solution. The amount of metal oxide precursor added to the solvent may be changed depending upon the viscosity of the coating solution. The coating solution may be coated to provide a metal oxide according to a sol-gel reaction.

The composition including the polyelectrolyte may be obtained by adding a polyelectrolyte to a solvent. The polyelectrolyte may be added at about 1 to about 5 wt % based on the total amount of the composition, but the amount of polyelectrolyte may be changed depending upon the coating process. The solvent may include linear ethers, e.g., dibutylether, 1,2-dimethoxyethane, 1,2-ethoxymethoxyethane, methyldiglyme, methyltriglyme, methyltetraglyme, ethylglyme, ethyldiglyme, butyldiglyme; glycolethers, e.g., ethylcellosolve, ethylcarbitol, butylcellosolve and/or butylcarbitol; heterocyclic ethers, e.g., tetrahydrofuran, 2-methyltetrahydrofuran, 1,3-dioxolane and/or 4,4-dimethyl-1,3-dioxane; butyrolactones, e.g., γ-butyrolactone, γ-valerolactone, δ-valerolactone, 3-methyl-1,3-oxazolidine-2-one and/or 3-ethyl-1,3-oxazolidine-2-one; water; alcohols, e.g., methanol, ethanol, butanol, ethyleneglycol, propylene glycol, diethylene glycol, 1,4-butanediol and/or glycerine; polyoxyalkylenepolyol, e.g., methyleneoxide, polypropyleneoxide and/or polyoxyethylene.oxypropyleneglycol; amides, e.g., N-methylformamide N,N-dimethyl formamide, N-methylacetamide and/or N-methylpyrrolidinone; carbonates, e.g., propylenecarbonate, ethylene carbonate and/or styrene carbonate; and an imidazolidinone solvent, e.g., 1,3-dimethyl-2-imidazolidinone. These solvents may be used singularly or as a mixture of two or more.

A middle electrode 109 may be provided on the buffer layer 107. The middle electrode 109 may be formed by adding a conductive polymer to a solvent to form a composition, and coating the same on the buffer layer 107. The conductive polymer may be added to a solvent at about 1 to about 3 wt % based on the total amount of the composition, but the amount of conductive polymer may be changed depending upon the coating process. The solvent may include alcohol, chloroform, chlorobenzene, difluorobenzene, tetrahydrofuran, xylene, dimethylsulfoxide and/or toluene. The coating method may include a wet process, e.g., gravure printing, off-set printing, screen printing, inkjet printing, spin coating and/or spray coating.

The second emission layer 105b formed on the middle electrode 109 may be provided by the same process as the first emission layer 105a, and the second electrode 103b may be provided in accordance with the same procedure as the first electrode 103a. Simplifying the process may be possible by providing each layer formed between the first electrode 103a and the second electrode 103b in accordance with the wet process. As such, the process cost may be reduced and productivity may be improved. The light emitting device may be applied to light emitting equipment having a light emitting controller of a light emitting device and a lighting device.

The following examples illustrate example embodiments in more detail. However, it may be understood that example embodiments are not limited by these examples.

Example 1

Aluminum was deposited on a polyethersulfone substrate to provide a 10 nm first electrode. A composition in which 1 wt % of poly(p-phenylenevinylene) (p-PPV) was added to a chlorobenzene solvent was spin-coated and heated at 80° C. for 60 minutes to provide a first emission layer. 0.1 wt % of titanium isopropoxide was added to 2-methoxy ethanol and ethanolamine to provide a solution. The solution was subjected to a sol-gel reaction to provide a titanium oxide, and was diluted in methanol and spin-coated to provide a buffer layer. 5 wt % of PEDOT:PSS was added to a dimethylsulfoxide solvent to provide a composition. The composition was spin coated and heated at 30° C. for 3 hours to provide a middle electrode. A composition in which 3 wt % of MEH-PPV was added to a chlorobenzene solvent was spin coated and heated at 100° C. for 60 minutes to provide a second emission layer. Ba:Al was deposited thereon at 10 nm/100 nm to provide a second electrode. Thereby, a light emitting device shown in FIG. 1 was obtained.

Figure 3A:
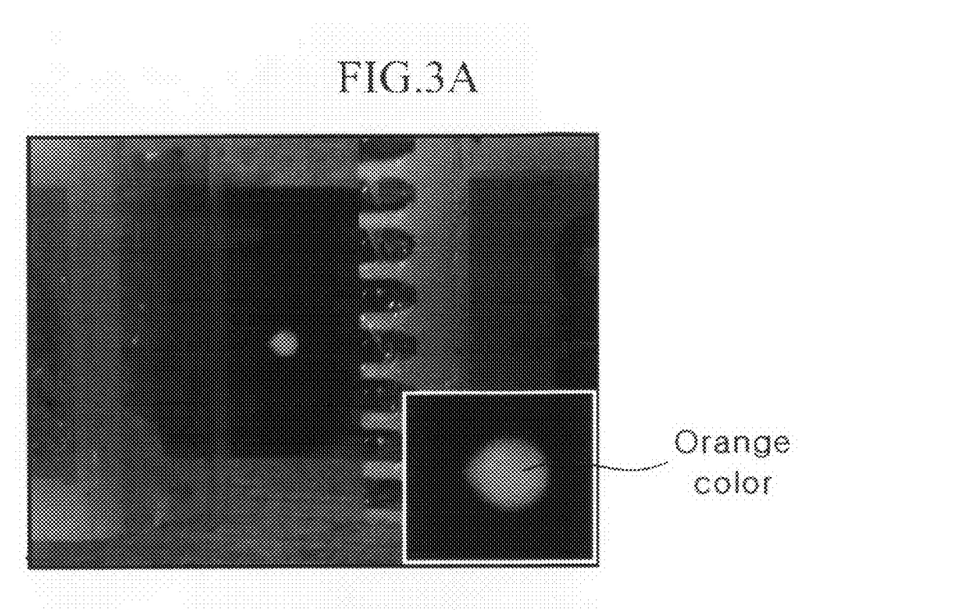
FIGS. 3A and 3C are photographs showing a top surface of a light emitting device according to Example 1.
Figure 3B:
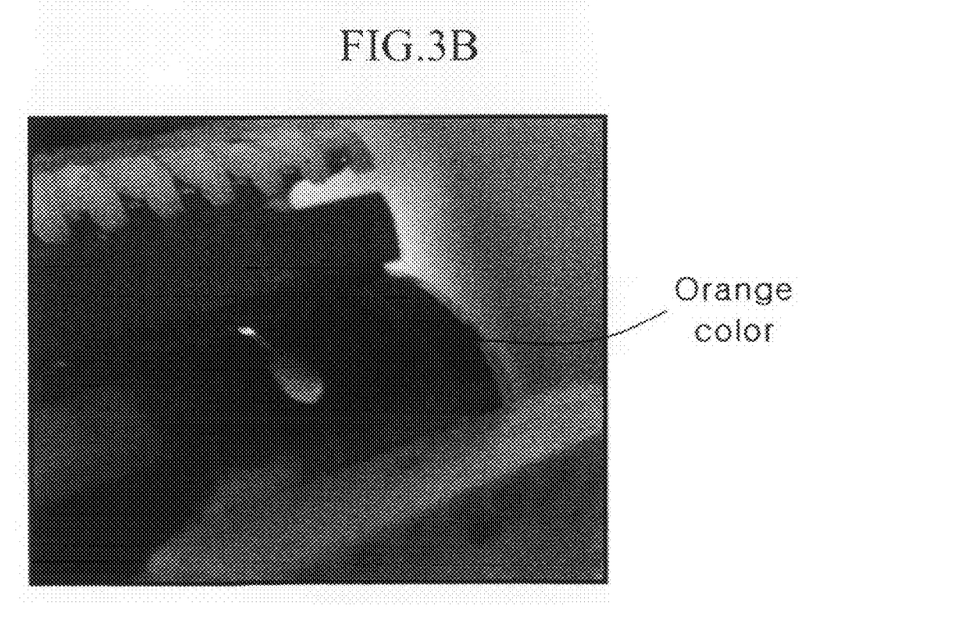
FIGS. 3B and 3D are photographs showing a side surface of a light emitting device according to Example 1 when applying a voltage of −10V and 10V between an Al electrode and a Ba:Al electrode, respectively.

FIG. 3A is a photograph showing a top surface of a light emitting device realizing an orange color according to Example 1, and FIG. 3B is a photograph showing a side surface of a light emitting device realizing an orange color according to Example 1 when applying a voltage of −10V between an Al electrode and a Ba:Al electrode.

Figure 3C:
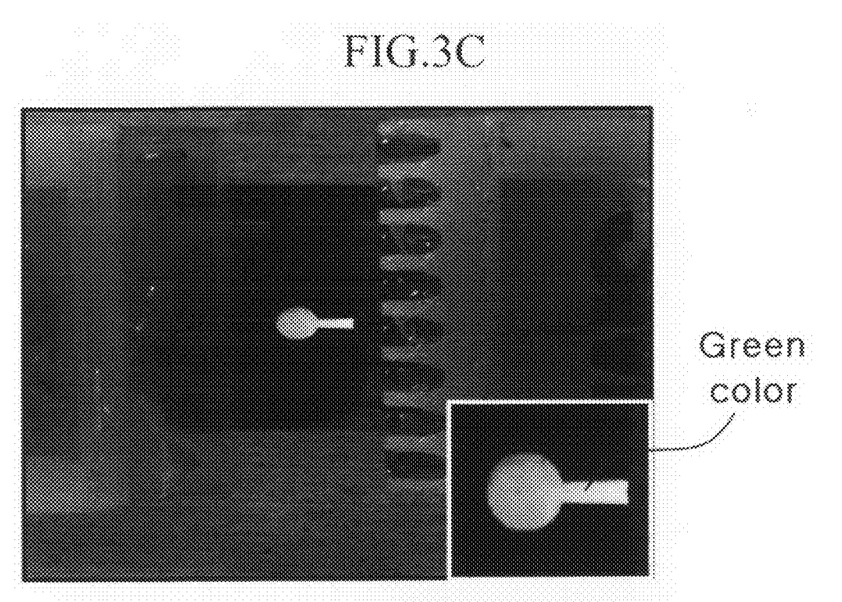
Figure 3D:
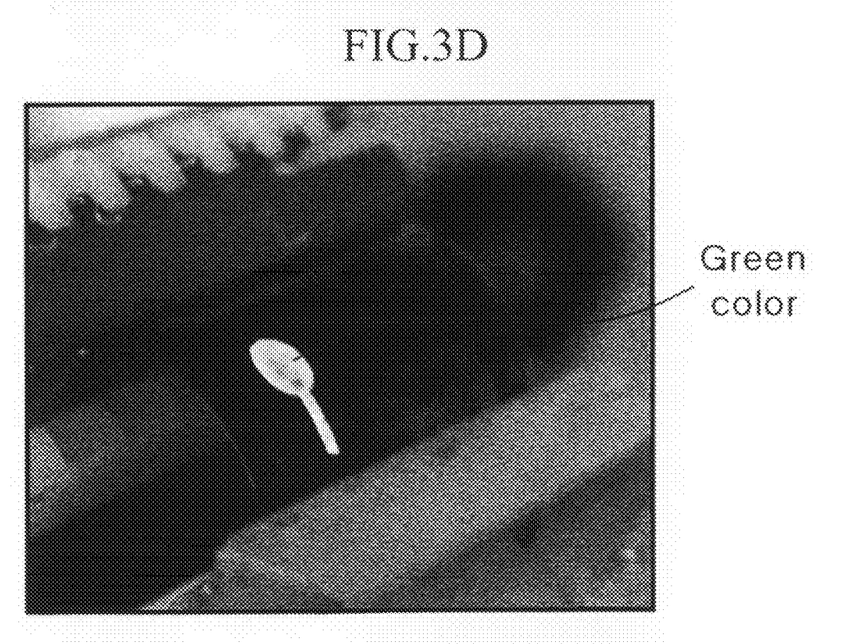

FIG. 3C is a photograph showing a top surface of a light emitting device realizing a green color according to Example 1, and FIG. 3D is a photograph showing a side surface of a light emitting device realizing a green color according to Example 1 when applying a voltage of 10V between an Al electrode and a Ba:Al electrode. As can be seen, controlling the light emitting color is possible, and FIG. 3B and FIG. 3D show that a flexible light emitting device was accomplished.

Example 2

Aluminum may be deposited on a polyethersulfone substrate to provide a 10 nm first electrode. A composition in which 1 wt % of poly(p-phenylenevinylene) (p-PPV) was added to a chlorobenzene solvent was spin coated thereon and heated at 80° C. for 60 minutes to provide a first emission layer. 0.1 wt % of poly[(9,9-bis(6'-N,N,N-trimethylammonium)hexyl)fluorenylene phenylene] (PFP) was dissolved in methanol and spin coated to provide a buffer layer. A composition in which 5 wt % of PEDOT:PSS was added to a dimethylsulfoxide solvent was spin coated and heated at 30° C. for 3 hours to provide a middle electrode. A composition in which 3 wt % of MEH-PPV was added to a chlorobenzene solvent was spin coated and heated at 100° C. for 60 minutes to provide a second emission layer. Ba:Al was deposited thereon at 10 nm/100 nm to provide a second electrode. Thereby, a light emitting device shown in FIG. 1 was obtained.

Comparative Example 1

Aluminum was deposited on a polyethersulfone substrate to provide a 10 nm first electrode. A composition in which 1 wt % of poly(p-phenylenevinylene) (p-PPV) was added to a chlorobenzene solvent was spin coated and heated at 80° C. for 60 minutes to provide a first emission layer. A composition in which 5 wt % of PEDOT:PSS was added to a dimethylsulfoxide solvent was spin coated. However, the composition did not provide a hydrophilic PEDOT:PSS thin film on a hydrophobic surface of a poly(p-phenylenevinylene) (p-PPV) thin film, such that a thin film was not obtained.

By using the light emitting device of example embodiments for a display, both light emission and control with one device may be possible, so two devices of an OLED and an OFET may not be required. Accordingly, simplifying the structure or manufacturing process is possible, resulting in reduced costs. In addition, the device may be disposed in a higher density, so expressing an image with higher resolution may be possible.

While example embodiments have been described in connection with what is presently considered to be practical example embodiments, it is to be understood that the disclosure is not limited to example embodiments, but, on the contrary, is intended to cover various modifications and equivalent arrangements included within the spirit and scope of the appended claims.

What is claimed is:

1. A light emitting device comprising:
   a first electrode on a substrate;
   a first emission layer on the first electrode;
   a buffer layer on the first emission layer;
   a middle electrode directly disposed on the buffer layer;
   a second emission layer on the middle electrode; and
   a second electrode on the second emission layer,
   wherein the buffer layer includes a hole transporting polymer,
   wherein the middle electrode includes a conductive polymer different from the hole transporting polymer, and
   wherein the hole transporting polymer is represented by one of the following Chemical Formulae 1 to 3:

[Chemical Formula 1]

wherein, in Chemical Formula 1,
   $R_1$ and $R_2$ are the same or different,
   $R_1$ and $R_2$ are selected from hydrogen, an alkyl, an alkenyl, an allyl, an aryl, (meth)acryl, (meth)acryloyl, and a combination thereof, and
   Y is a counter anion,

[Chemical Formula 2]

wherein, in Chemical Formula 2,
   $R_3$, $R_4$ and $R_6$ are the same or different, at least one of the $R_3$, $R_4$ and $R_6$ groups is different from each other, the $R_3$, $R_4$ and $R_6$ groups are not linked to each other,
   $R_3$, $R_4$ and $R_6$ are selected from hydrogen, an alkyl, an alkenyl, an allyl, an aryl, (meth)acryl, (meth)acryloyl, and a combination thereof, and
   Y is a counter anion,

[Chemical Formula 3]

wherein, in Chemical Formula 3,
   $R_7$ to $R_8$ are the same or different, $R_7$ to $R_8$ are not linked to each other, and $R_7$ to $R_8$ are selected from hydrogen, an alkyl, an alkenyl, an allyl, an aryl, (meth)acryl, (meth)acryloyl, and a combination thereof, and
   wherein the hole transporting polymer includes a fluorene alkyl ammonium salt, a poly(diallyldialkyl ammonium salt), a poly((meth)acryloyloxyalkyltrialkyl ammonium salt), poly((meth)acryloyloxyalkylaryldialkyl ammonium salt), poly(arylamine salt), poly(allylamine salt), poly(alkylene imine), poly((meth)acrylamide), poly(alkenyl amine), or a combination thereof.

2. The light emitting device of claim 1, wherein the substrate includes a material selected from the group consisting of glass, quartz, silicon, a synthetic resin, a metal, and a combination thereof.

3. The light emitting device of claim 1, wherein the first electrode includes a material having a work function of about 4.3 eV to about 5.0 eV, and the second electrode includes a material having a work function of about 2.3 eV to about 2.7 eV.

4. The light emitting device of claim 1, wherein the middle electrode includes a material having a work function of about 4.3 eV to about 5.0 eV.

5. The light emitting device of claim 1, wherein the conductive polymer includes polythiophene, polyaniline, polypyrrole, polyacene, polyphenylene, polyphenylenevinylene, a derivative thereof, a copolymer thereof, or a mixture thereof.

6. The light emitting device of claim 1, wherein the conductive polymer includes polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxylpyrrole), poly(3-methyl-4-hydroxylpyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), or a mixture thereof.

7. The light emitting device of claim 1, wherein the conductive polymer is doped with a dopant.

8. The light emitting device of claim 1, wherein the hole transporting polymer has a weight average molecular weight of about 500 to about 20,000 g/mol.

9. The light emitting device of claim 1, further comprising:
   a buffer layer between at least one of the first electrode and the first emission layer, and the second emission layer and the second electrode.

10. The light emitting device of claim 1, further comprising:
    a hole blocking layer (HBL) between at least one of the first electrode and the first emission layer, and the second electrode and the second emission layer.

11. A method of manufacturing a light-emitting device comprising:
    providing a first electrode on a substrate;
    providing a first emission layer on the first electrode;
    providing a buffer layer on the first emission layer;

providing a middle electrode directly disposed on the buffer layer;
providing a second emission layer on the middle electrode; and
providing a second electrode on the second emission layer,
wherein the first emission layer, the buffer layer, the middle electrode, and the second emission layer are made using a wet process,
wherein the buffer layer includes a hole transporting polymer,
wherein the middle electrode includes a conductive polymer different from the hole transporting polymer, and
wherein the hole transporting polymer is represented by one of the following Chemical Formulae 1 to 3:

[Chemical Formula 1]

wherein, in Chemical Formula 1,
$R_1$ and $R_2$ are the same or different,
$R_1$ and $R_2$ are selected from hydrogen, an alkyl, an alkenyl, an allyl, an aryl, (meth)acryl, (meth)acryloyl, and a combination thereof, and
Y is a counter anion,

[Chemical Formula 2]

wherein, in Chemical Formula 2,
$R_3$, $R_4$ and $R_6$ are the same or different, at least one of the $R_3$, $R_4$ and $R_6$ groups is different from each other, the $R_3$, $R_4$ and $R_6$ groups are not linked to each other,
$R_3$, $R_4$ and $R_6$ are selected from hydrogen, an alkyl, an alkenyl, an allyl, an aryl, (meth)acryl, (meth)acryloyl, and a combination thereof, and
Y is a counter anion,

[Chemical Formula 3]

wherein, in Chemical Formula 3,
$R_7$ to $R_8$ are the same or different, $R_7$ to $R_8$ are not linked to each other, and $R_7$ to $R_8$ are selected from hydrogen, an alkyl, an alkenyl, an allyl, an aryl, (meth)acryl, (meth)acryloyl, and a combination thereof, and
wherein the hole transporting polymer includes a fluorene alkyl ammonium salt, a poly(diallyldialkyl ammonium salt), a poly((meth)acryloyloxyalkyltrialkyl ammonium salt), poly((meth)acryloyloxyalkylaryldialkyl ammonium salt), poly(arylamine salt), poly(allylamine salt), poly(alkylene imine), poly((meth)acrylamide), poly(alkenyl amine), or a combination thereof.

12. The method of claim 11, wherein the wet process includes at least one of gravure printing, off-set printing, screen printing, inkjet printing, spin coating, spray coating, or combinations thereof.

13. The method of claim 11, wherein the buffer layer is formed by coating a composition including a polyelectrolyte on the first emission layer directly.

14. The light emitting device of claim 1, further comprising:
an electron transport layer (ETL) between at least one of the first electrode and the first light emission layer, and the second light emission layer and the second electrode.

* * * * *